US010784268B1

(12) United States Patent
Kothandaraman et al.

(10) Patent No.: US 10,784,268 B1
(45) Date of Patent: Sep. 22, 2020

(54) OTP ELEMENTS WITH HIGH ASPECT RATIO MTJ

(71) Applicant: International Business Machines Corporation, Armonk, NY (US)

(72) Inventors: Chandrasekharan Kothandaraman, New York, NY (US); Babar Khan, Ossining, NY (US); Nathan P. Marchack, New York, NY (US); Bruce B. Doris, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/360,556

(22) Filed: Mar. 21, 2019

(51) Int. Cl.

| H01L 27/112 | (2006.01) |
|---|---|
| H01L 27/22 | (2006.01) |
| H01L 43/12 | (2006.01) |
| H01L 43/02 | (2006.01) |
| H01L 23/525 | (2006.01) |

(52) U.S. Cl.
CPC .... H01L 27/11206 (2013.01); H01L 23/5252 (2013.01); H01L 27/222 (2013.01); H01L 43/02 (2013.01); H01L 43/12 (2013.01)

(58) Field of Classification Search
CPC ........... H01L 23/5252; H01L 27/11206; H01L 27/222; H01L 43/02; H01L 43/12
See application file for complete search history.

(56) References Cited

U.S. PATENT DOCUMENTS

| 9,614,144 | B1 | 4/2017 | Annunziata et al. |
| 9,754,679 | B2 | 9/2017 | Chung |
| 9,818,464 | B2 * | 11/2017 | Saida ................. H01F 10/3286 |
| 2005/0059170 | A1 * | 3/2005 | Min ....................... G11C 11/15 |
| | | | 438/3 |
| 2012/0135273 | A1 * | 5/2012 | Horng .................. H01F 41/307 |
| | | | 428/828.1 |
| 2016/0379698 | A1 * | 12/2016 | Saida ..................... H01L 43/10 |
| | | | 365/158 |
| 2017/0154890 | A1 | 6/2017 | Jin et al. |
| 2018/0047736 | A1 | 2/2018 | Seo et al. |
| 2018/0226571 | A1 | 8/2018 | Umebayashi et al. |
| 2019/0067561 | A1 * | 2/2019 | Avci ....................... H01L 43/06 |
| 2019/0287591 | A1 * | 9/2019 | Perrissin-Fabert ........................ |
| | | | G11C 11/161 |

FOREIGN PATENT DOCUMENTS

CN 104681558 A 6/2015

OTHER PUBLICATIONS

Jan, G., et al., "Demonstration of an MgO Based Anti-Fuse OTP Design Integrated With a Fully Functional STT-MRAM at the Mbit Level", 2015 Symposium on VLSI Technology Digest of Technical Papers, pp. T164-T165.

* cited by examiner

*Primary Examiner* — Allan R Wilson
(74) *Attorney, Agent, or Firm* — Scully, Scott, Murphy & Presser, P.C.; Daniel P. Morris, Esq.

(57) ABSTRACT

A magnetic tunnel junction (MTJ) containing device and methods of constructing the MTJ containing device are described. In an example, the MTJ containing device may be a memory element including a bottom electrode structure, a MTJ pillar, and a top electrode structure located on the MTJ pillar. The MTJ pillar has a non-circular lateral cross section, where the MTJ pillar has a bottommost portion forming an interface with an uppermost portion of the bottom electrode structure. The MTJ pillar has a lateral perimeter-to-area ratio that defines a breakdown voltage of the MTJ pillar.

20 Claims, 3 Drawing Sheets

OTP ELEMENTS WITH HIGH ASPECT RATIO MTJ

BACKGROUND

The present application relates to a magnetic tunnel junction (MTJ) containing device and a method of forming the same. More particularly, the present application relates to one-time programmable (OTP) memory elements constructed from MTJ pillars having a high aspect ratio.

Magnetoresistive random access memory (MRAM) is a non-volatile random access memory technology in which data is stored by magnetic storage elements. These elements are typically formed from two ferromagnetic plates, each of which can hold a magnetization, separated by a thin dielectric layer, i.e., the tunnel barrier. One of the two plates is a permanent magnet set to a particular polarity; the other plate's magnetization can be changed to match that of an external field to store memory. Such a configuration is known as a magnetic tunnel junction (MTJ) pillar.

In some examples, standard MTJs used in MRAM can be used in one-time programmable (OTP) memory elements or bits. Data is being written to an OTP bit by applying an amount of voltage exceeding a breakdown voltage of the MTJ to cause an electrical short, or to blow a fuse. An OTP bit, without voltage being applied, is registered as logic '1'. The occurrence of the electrical short causes the OTP bit to register a logic '0'. The electrical short is irreversible, thus causing the '0' to be permanently written in the OTP bit. However, the relatively high programming voltage required to program the OTP bits (e.g., the voltage to cause a breakdown) may lead to various technical challenges such as low drive current from access transistors, large area of programming circuitry, reliability of unselected devices, and/or other technical challenges.

To write data to the OTP bits with less programming voltage, the breakdown voltage of the OTP bits may need to be reduced. In some examples, OTP bits can be manufactured at smaller sizes to reduce the breakdown voltage. However, the OTP bits and corresponding devices printed in smaller sizes can cause manufacturing control issues. In some examples, it may be advantageous to use MTJ based anti-fuses as OTP elements in memory devices. MRAM bits can be relatively larger in size when compared to OTP bits. However, MRAM bits can be designed to have a relatively high breakdown voltage to provide a feature of rewriting data to the MRAM bit multiple times without causing accidental breakdowns. Based on this feature, MRAM bits may be typically used in multi-time programmable (MTP) memory elements.

SUMMARY

In some examples, a memory element is generally described. The memory element includes a bottom electrode structure. The memory element further includes a MTJ pillar having a non-circular lateral cross section. The MTJ pillar has a bottommost portion forming an interface with an uppermost portion of the bottom electrode structure. The MTJ pillar has a lateral perimeter-to-area ratio that defines a breakdown voltage of the MTJ pillar. The memory element further includes a top electrode structure located on the MTJ pillar.

In some examples, a method of forming a one-time programmable (OTP) memory element is generally described. The method includes forming a multilayered magnetic tunnel junction (MTJ) stack on an uppermost portion of a bottom electrode structure. The method further includes disposing a top electrode structure on the multilayered MTJ stack. The method further includes etching the multilayered MTJ stack utilizing the top electrode structure as an etch mask to provide a MTJ pillar having a non-circular lateral cross section. The MTJ pillar has a lateral perimeter-to-area ratio that defines a breakdown voltage of the MTJ pillar.

In some examples, a memory device is generally described. The memory device includes a first memory element and a second memory element. The first memory element includes a first bottom electrode structure. The first memory element further includes a first MTJ pillar having a non-circular lateral cross section. The first MTJ pillar has a bottommost portion forming an interface with an uppermost portion of the bottom electrode structure. The first MTJ pillar has a lateral perimeter-to-area ratio that defines a first breakdown voltage of the first MTJ pillar. The first memory element further includes a top electrode structure located on the first MTJ pillar. The second memory element is laterally adjacent to the first memory element. The second memory element includes a second MTJ pillar having a second breakdown voltage greater than the first breakdown voltage of the first MTJ pillar.

DETAILED DESCRIPTION

Figure 1:
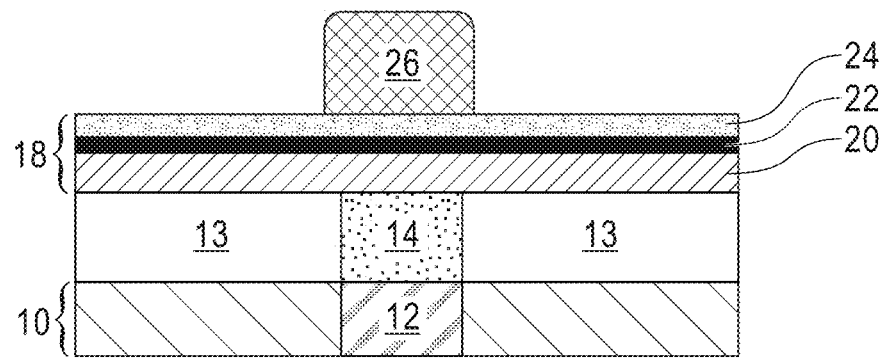
FIG. 1 is a cross sectional view of an exemplary structure of the present application during an early stage of fabrication, the structure including a bottom electrode structure located on a surface of an electrically conductive structure that is embedded in an interconnect dielectric material layer, a multilayered magnetic tunnel junction (MTJ) stack deposited on the bottom electrode structure, and a top electrode structure disposed on the MTJ stack.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

In some examples, MRAM bits may be utilized as OTP bits, but the breakdown voltage of the MRAM bits may need to be reduced. To be described in more detail below, an OTP structure with reduced programming voltage can be constructed by changing edge conditions of MRAM bits that include MTJ pillars. For example, an OTP structure can be composed of a MTJ pillar having a non-circular lateral cross section with a relatively high lateral perimeter-to-area ratio, and/or lateral aspect ratio, such as ranging from 1:15 to 1:10. The high perimeter-to-area ratio and/or aspect ratio of the lateral cross section of the MTJ pillar enlarges the peripheral surface of the edge of the MTJ pillar. Due to the edges of the MTJ pillar having damaged regions as a result of patterning processes, an increase in the peripheral surface of the edges of the MTJ pillar exposes more damaged regions to incoming voltages. The additional exposure of such peripheral damaged regions of the MTJ pillar can cause the MTJ pillar to breakdown earlier, or at a lower voltage. Therefore, the programming voltage of the constructed OTP bits can be reduced. Further, the OTP bits can be constructed on a wafer that includes other MRAM bits without impacting the MRAM bits on the same wafer.

FIG. 1 is a cross sectional view of an exemplary structure of the present application during an early stage of fabrication. The structure of FIG. 1 provides or includes a bottom electrode structure 14 located on a surface of an electrically conductive structure 12 that is embedded in an interconnect dielectric material layer 10. The structure further includes a bottom electrode structure 14 located on a surface of the electrically conductive structure 12 that is embedded in an interconnect dielectric material layer. The structure further includes a multilayered magnetic tunnel junction (MTJ) stack 18 deposited on an upmost portion of the bottom electrode structure 14, and a top electrode structure 26 disposed on the MTJ stack 18.

Although not shown, a diffusion barrier liner can be formed on the sidewalls and bottom wall of the electrically conductive structure 12. Collectively, the electrically conductive structure 12, the diffusion barrier liner (if present), and the interconnect dielectric material layer 10 provide an interconnect level It is noted that at least one other interconnect level and/or a middle-of-the-line (MOL) level may be located beneath the interconnect level including the interconnect dielectric material layer 10, the electrically conductive structure 12, and, if present, diffusion barrier liner. These other levels are not shown for clarity.

The interconnect dielectric material layer 10 can be composed of any interconnect dielectric material including, for example, silicon dioxide, silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The electrically conductive structure 12 can be composed of an electrically conductive metal or metal alloy. Examples of electrically conductive materials that may be used in the present application include copper (Cu), aluminum (Al), or tungsten (W), while an example of an electrically conductive metal alloy is a Cu—Al alloy.

In some embodiments, a diffusion barrier liner can be formed along the sidewalls and a bottom wall of the electrically conductive structure 12. In some embodiments, no diffusion barrier liner is present. The diffusion barrier liner is composed of a diffusion barrier material (i.e., a material that serves as a barrier to prevent a conductive material such as copper from diffusing there through). Examples of diffusion barrier materials that can be used in providing the diffusion barrier liner include, but are not limited to, Ta, TaN, Ti, TiN, Ru, RuN, *RuTa*, RuTaN, W, or WN. In some embodiments, the diffusion barrier material may include a material stack of diffusion barrier materials. In one example, the diffusion barrier material can be composed of a stack of Ta/TaN.

The interconnect level including the interconnect dielectric material layer 10, the electrically conductive structure 12, and, if present, the diffusion barrier liner can be formed utilizing conventional processes that are well-known to those skilled in the art including, for example, a damascene process. So as not to obscure the method of the present application, the techniques used to form the interconnect level including the interconnect dielectric material layer 10, the electrically conductive structure 12, and, if present, diffusion barrier liner are not provided herein.

Bottom electrode structure 14, which is located on a uppermost, or topmost, surface or portion of the electrically conductive structure 12, can be composed of a conductive material such as, for example, Ta, TaN, Ti, TiN, Ru, RuN, RuTa, RuTaN, Co, Cu, CoWP, CoN, W, WN or any combination thereof. The bottom electrode structure 14 may have a thickness from 2 nm to 25 nm; other thicknesses are possible and can be used in the present application as the thickness of the bottom electrode structure 14. The bottom electrode structure 14 can be formed by deposition processes such as, for example, sputtering, atomic layer deposition (ALD), chemical vapor deposition (CVD), plasma enhanced chemical vapor deposition (PECVD) or physical vapor deposition (PVD).

The bottom electrode structure 14 may be of an arbitrary size and/or shape. The bottom electrode structure 14 can be formed by processes such as, an etch back process, a planarization process (such as, for example, chemical mechanical polishing), or a patterning process (such as, for example, lithography and etching). In an example embodiment, the bottom electrode structure 14 can be formed on a non-recessed surface or portion of the electrically conductive structure 12. In such an embodiment, a dielectric capping layer 13 is located laterally adjacent to the bottom electrode structure 14 and on a surface of the interconnect dielectric material layer 10. In this embodiment, a smaller width bottom electrode structure 14 can be provided that does not cover the entirety of the uppermost surface of the electrically conductive structure 12. It is noted that the bottom electrode structure 14 may be of an arbitrary size, shape, dimensions, and the bottom electrode structure 14 may have dimensions greater than or less than the dimensions of the electrically conductive structure 12.

When present, the dielectric capping layer 13 can be composed of any dielectric material such as, for example, SiC, $Si_3N_4$, $SiO_2$, a carbon doped oxide, a nitrogen and hydrogen doped silicon carbide SiC(N,H) or multilayers thereof. The dielectric capping layer 13 can be formed utilizing a conventional deposition process such as, for example, chemical vapor deposition (CVD), plasma enhanced chemical vapor deposition (PECVD), chemical solution deposition, evaporation, or plasma enhanced atomic layer deposition (PEALD). In some embodiments and as is illustrated in FIG. 1, the bottom electrode structure 14 has a uppermost surface or portion that is coplanar with a uppermost surface or portion of a dielectric capping layer 13 that may be present laterally adjacent to the bottom electrode structure 14 and on a uppermost surface of the interconnect dielectric material layer 10.

The dielectric capping layer 13 can be formed prior to, or after, constructing the bottom electrode structure 14. In embodiments when the dielectric capping layer 13 is formed prior to the bottom electrode structure 14, a blanket layer of dielectric capping material is formed and thereafter an opening is formed (by photolithography and etching) in the dielectric capping material. The opening may have substantially identical size, shape, and/or dimensions as the bottom electrode structure 14. The bottom electrode structure 14 can be formed in the opening of the dielectric capping layer 13. In such an embodiment, the bottom electrode structure 14 can be formed by deposition of conductive materials into the opening of the dielectric capping layer 13, followed by a planarization process. In embodiments in which the bottom electrode structure 14 is formed prior to the dielectric capping layer 13, the bottom electrode structure 14 is formed by patterning (e.g., performing various etching processes on the bottom electrode structure 14), and thereafter dielectric capping material is deposited and a subsequent planarization process may be performed to form the dielectric capping layer 13.

In another example embodiment, the bottom electrode structure 14 may be constructed within a recessed portion of the electrically conductive structure 12. In such an embodiment, an upper portion of the electrically conductive structure 12 may be removed by utilizing a recess etching process. The removed portion of the electrically conductive structure 12 may be substantially identical to a size, shape, and/or dimensions of the bottom electrode structure 14. The conductive material of the bottom electrode structure 14 may be deposited into the recess form in the electrically conductive structure 12. The deposition of the conductive materials into the recess may fill the recess with the conductive material forming a desired size and/or shape of the bottom electrical structure 14. Also, in such an embodiment, a planarization process may be utilized to remove any excess conductive material, or to smooth an uppermost surface of the deposited conductive materials to form the uppermost surface of the bottom electrode structure 14. The planarization process may cause the uppermost surface of the bottom electrode structure 14 to be coplanar with the uppermost surface of the interconnect dielectric material layer 10. Also, in such an embodiment, the bottom electrode structure 14 may be located on an entirety of the recess of the electrically conductive structure 12. Also, and in such an embodiment, an upper portion of the interconnect dielectric material layer 10 may be laterally adjacent to each sidewall of the bottom electrode structure 14. Further, and in such an embodiment, the dielectric capping layer 13 may be omitted from the structure.

The multilayered magnetic tunnel junction (MTJ) stack 18 may be deposited on a portion of the entirely planar uppermost surface of the bottom electrode structure 14 and/or the capping layer 13. The MTJ stack 18 includes at least a magnetic reference layer 20, a tunnel barrier layer 22, and a magnetic free layer 24. In some embodiments (not shown), the MTJ stack 18 may also include a non-magnetic spacer layer located on the magnetic free layer, a second magnetic free layer located on the non-magnetic spacer layer, and/or a MTJ cap layer located on the magnetic free layer 24 or on the second magnetic free layer. Although not shown, the order of the MTJ stack 18 may be reversed such that the magnetic free layer 24 is formed beneath the tunnel barrier layer 18 and the magnetic reference layer 20. The various material layers of the MTJ stack 18 can be formed by utilizing one or more deposition processes such as, for example, plating, sputtering, atomic layer deposition (ALD), chemical vapor deposition (CVD), plasma enhanced chemical vapor deposition (PECVD) or physical vapor deposition (PVD).

In the example shown in FIG. 1, the magnetic reference layer 20 has a fixed magnetization. The magnetic reference layer 20 can be composed of a metal or metal alloy (or a stack thereof) that includes one or more metals exhibiting high spin polarization. In alternative embodiments, exemplary metals for the formation of the magnetic reference layer 20 include iron, nickel, cobalt, chromium, boron, or manganese. Exemplary metal alloys may include the metals exemplified by the above. In another embodiment, the magnetic reference layer 20 may be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed.

The tunnel barrier layer 22 is composed of an insulator material and is formed at such a thickness as to provide an appropriate tunneling resistance. Exemplary materials for the tunnel barrier layer 22 include magnesium oxide (MgO), aluminum oxide, and titanium oxide, or materials of higher electrical tunnel conductance, such as semiconductors or low-bandgap insulators.

The magnetic free layer 24 can be composed of a magnetic material (or a stack of magnetic materials) with a magnetization that can be changed in orientation relative to the magnetization orientation of the magnetic reference layer 20. Exemplary magnetic materials for the magnetic free layer 24 include alloys and/or multilayers of cobalt, iron, alloys of cobalt-iron, nickel, alloys of nickel-iron, and alloys of cobalt-iron-boron.

If present, the non-magnetic metallic spacer layer is composed of a non-magnetic metal or metal alloy that allows magnetic information to be transferred therethrough and also permits the two magnetic free layers to couple together magnetically, so that in equilibrium the first and second magnetic free layers are always parallel. The non-magnetic metallic spacer layer allows for spin torque switching between the first and second magnetic free layers.

If present, the second magnetic free layer may include one of the magnetic materials mentioned above for magnetic free layer 24. In one embodiment, the second magnetic free layer is composed of a same magnetic material as the magnetic free layer 24. In another embodiment, the second magnetic free layer is composed of a magnetic material that is compositionally different from the magnetic free layer 24.

If present, the MTJ cap layer can be composed of Nb, NbN, W, WN, Ta, TaN, Ti, TiN, Ru, Mo, Cr, V, Pd, Pt, Rh, Sc, Al or other high melting point metals or conductive metal nitrides. The MTJ cap layer may have a thickness from 2 nm to 25 nm; other thicknesses are possible and can be used in the present application as the thickness of the MTJ cap layer.

The top electrode structure 26 may be located on the multilayered MTJ stack. In the present application, the top electrode structure 26 may serve as an etch mask. The top electrode structure 26 can be composed of one of the conductive materials mentioned above for the bottom electrode structure 14. The conductive material that provides the top electrode structure 26 is typically compositionally different from the optional MTJ cap layer. The top electrode structure 26 can have a thickness within the thickness range mentioned above for the bottom electrode structure 14. The top electrode structure 26 can be formed utilizing one of the deposition processes mentioned above in providing the bottom electrode structure 14, followed by performing a patterning process, such as, for example, photolithography and etching.

It is noted that the drawings of the present application illustrate a device area in which a MTJ containing device will be formed. Exemplary MTJ containing devices include, but are not limited to, memory devices (e.g., MRAM, spin-transfer torque (STT) MRAM, OTP memory devices), or sensors such as, for example, pressure sensors. A non-MTJ containing device area may be located adjacent to the MTJ containing device area illustrated in the drawings of the present application. It is also noted that while a single bottom electrode structure and a single top electrode structure are described and illustrated, the present application can be used when a plurality of bottom electrode structures and a plurality of top electrode structure are formed.

Figure 2:
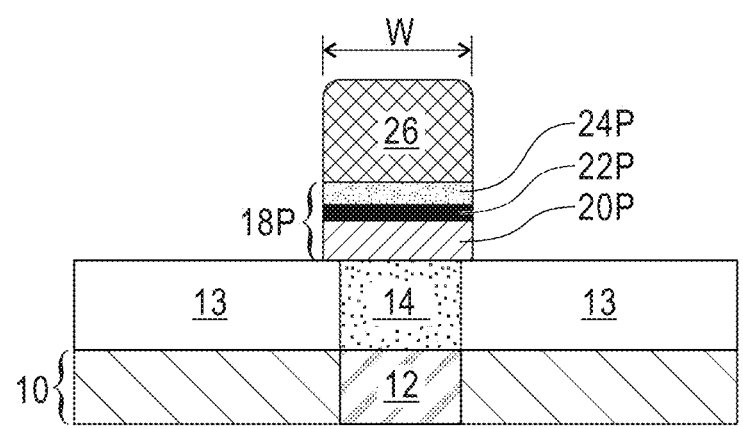
FIG. 2 is a cross sectional view of the structure of FIG. 1 after etching the MTJ stack utilizing the top electrode structure as an etch mask to provide a MTJ pillar.

FIG. 2 is a cross sectional view of the structure of FIG. 1 after etching the MTJ stack 18 utilizing the top electrode structure 26 as an etch mask to provide a MTJ pillar 18P. The etching of the multilayered MTJ stack 18 may include one or more etching steps. The one or more etching steps may include one or more reactive ion etching processes. A MTJ pillar 18P can be formed or constructed as a result of performing the one or more etching processes. Although not shown, another electrically conductive structure can be formed contacting a surface of the top electrode structure 26. This other electrically conductive structure may be embedded in another interconnect dielectric material that is formed laterally adjacent to, and above, the stack including the MTJ pillar 18P and the top electrode structure 26.

As is shown, the MTJ pillar 18P has at least one sidewall that may be vertically aligned to the sidewall of the top electrode structure 26. In some examples, a width, or lateral dimension, of the top electrode structure 26 may be substantially identical to a width, or lateral dimension, of the MTJ pillar 18P. The MTJ pillar 18P may include at least a remaining portion of the magnetic reference layer 20 (hereinafter magnetic reference material 20P), a remaining portion of the tunnel barrier layer 22 (hereinafter tunnel barrier material 22P) and a remaining portion of the magnetic free layer 24 (hereinafter magnetic free material 24P). In some embodiments, the MTJ pillar 18P may also include a remaining portion of the non-magnetic spacer, a remaining portion of the second magnetic reference layer, and/or a remaining portion of the MTJ cap layer.

In some examples, the MTJ pillar 18P may be patterned using, for example, an ion beam etching (IBE) process. The patterning of MTJ pillar 18P, in some examples, may continue until the sidewalls of the MTJ pillar 18P are vertically aligned to the sidewalls of the bottom electrode structure 14. In such examples, the sidewalls of MTJ pillar 18P and bottom electrode structure 14 may vertically aligned and the uppermost surface of the bottom electrode structure 14 may not be exposed to the patterning process. If the uppermost surface of the bottom electrode structure 14 is exposed to the patterning process, conductive metal particles (e.g., from the materials of the bottom electrode structure 14) can resputter from the bottom electrode structure 14 and deposit on the sidewalls of the MTJ pillar 18P.

The patterning of MTJ pillar 18P may stop prior to the sidewalls of the MTJ pillar 18P being vertically aligned with the sidewalls of the bottom electrode structure 14 to avoid exposing the bottom electrode structure 14 to the patterning process. Thus, the lateral dimension of the bottommost surface or portion of the MTJ pillar 18P may be equal to or larger than the lateral dimension of the uppermost surface or portion of the bottom electrode structure 14 to prevent conductive metal particles from the bottom electrode structure 14 being deposited on the sidewalls, or outermost sidewalls, of the MTJ pillar 18P.

Figure 3:
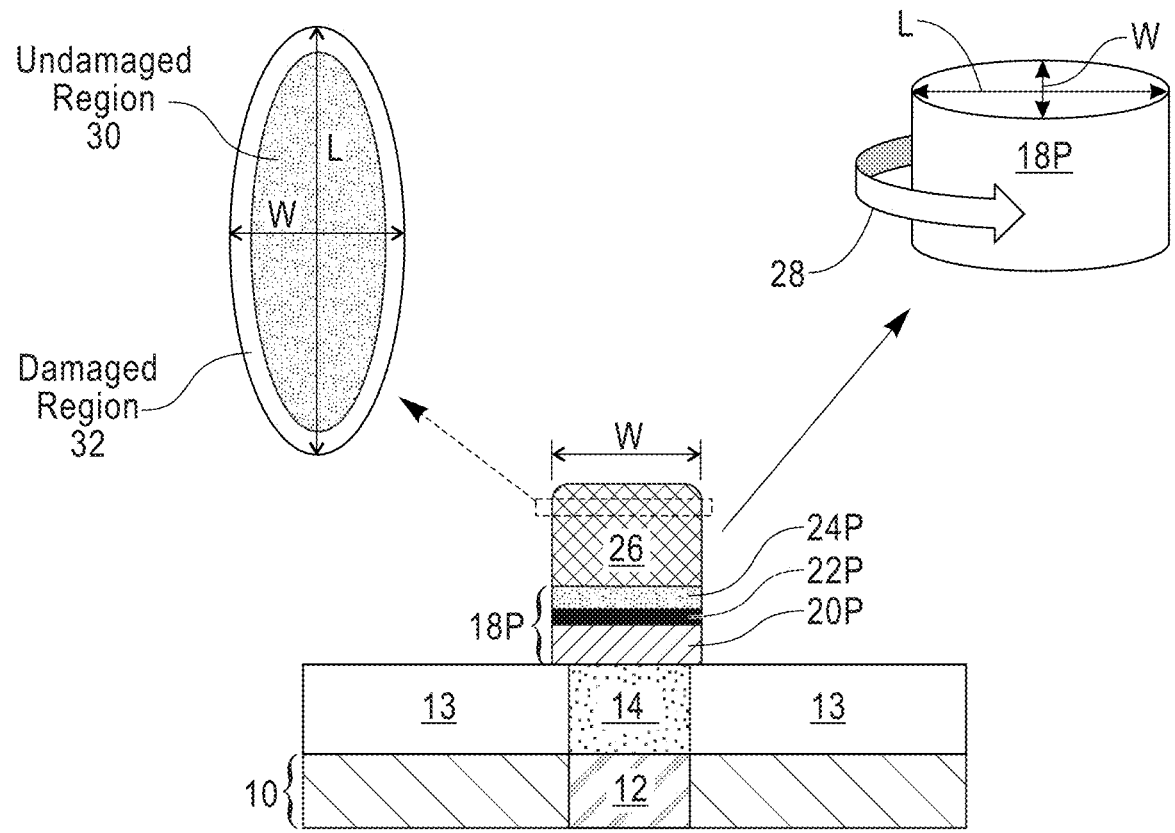
FIG. 3 is a top perspective view of a lateral cross section of a MTJ pillar provided by etching the MTJ stack of the structure of FIG. 2.

FIG. 3 is a top perspective view of a lateral cross section of a MTJ pillar 18P provided by etching the MTJ stack of the structure of FIG. 2. Typically, a MTJ pillar and the top electrode structure 26 (or the etching mask) may be cylindrical in shape with a circular lateral cross section. However, the MTJ pillar 18P described in accordance with the present disclosure is patterned to have a non-circular lateral cross section with a relatively high perimeter-to-area ratio, such as ranging from 1:15 to 1:10. The high perimeter-to-area ratio of the lateral cross section of the MTJ pillar 18P causes the MTJ pillar 18P to have a large peripheral surface area 28, or sidewall(s). In some example embodiments, the non-circular lateral cross section of the MTJ pillar 18P can have a relatively high aspect ratio (e.g., a length (L) to width (W) ratio), the high aspect ratio of the lateral cross section of the MTJ pillar 18P can also cause the MTJ pillar 18P to have a large peripheral surface area 28, or sidewall(s).

Focusing on a top perspective view of a non-circular lateral cross section of the MTJ pillar 18P, due to the patterning of the MTJ pillar 18P, the peripheral surface area 28 may include a damaged region 32. The damaged region 32 may include amorphous layers of materials (materials that form the MTJ pillar 18P) with lower crystallinity than undamaged region 30 of the MTJ pillar 18P. The damaged region 32 can breakdown earlier than the undamaged region 30 in response to voltage being applied on the MTJ pillar 18P. An increase in the perimeter-to-area ratio of the lateral cross section of the MTJ pillar 18P increases a perimeter of the lateral cross section, and decreases a lateral area of the space occupied by the MTJ pillar 18P. The increase of the perimeter of the lateral cross section of the MTJ pillar enlarges the damaged region 32. Thus, an increase in the size of the damaged region 32 can reduce a breakdown voltage of the MTJ pillar 18P.

In particular, the MTJ pillar 18P may have an elliptical lateral cross section. It is noted that other lateral cross section shapes are possible as long as the perimeter-to-area ratio is scaled to provide the damaged region 32 of a desired size. A desired size may be a size of the damaged region 32 that can reduce a breakdown voltage of the MTJ pillar 18 by a particular amount. In an example, the top electrode structure 26 may be scaled or designed to have the desired size and shape of the lateral cross section of the MTJ pillar 18P, such as an ellipse having a major axis of L and a minor axis of W. Thus, the patterning of the MTJ pillar 18P using the top electrode structure 26 as an etch mask can shape the MTJ pillar 18P to a desired shape and size to reduce the breakdown voltage of the MTJ pillar 18P. In an example embodiment, an increase in the lateral perimeter-to-area ratio of the MTJ pillar 18P can be directly proportional to an increase in a probability of breakdown of the MTJ pillar 18P when a given voltage is applied. In another example embodiment, an increase in the lateral aspect ratio of the MTJ pillar 18P can be directly proportional to an increase in a probability of breakdown of the MTJ pillar 18P when a given voltage is applied.

Figure 4:
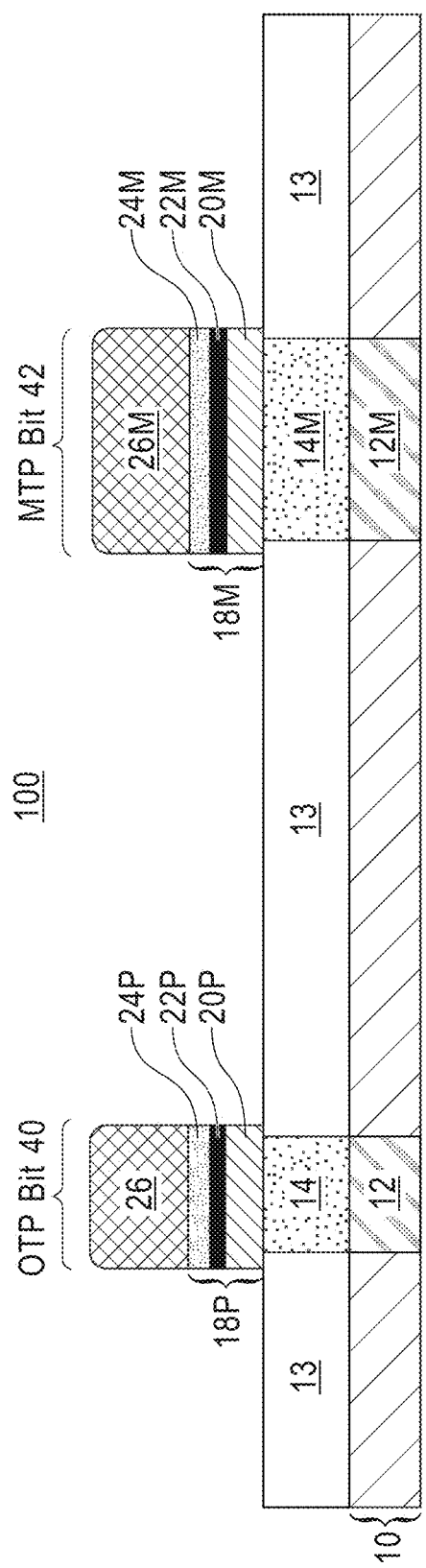
FIG. 4 is a cross sectional view of a memory device including the structure described in accordance with the present disclosure.

FIG. 4 is a cross sectional view of a memory device including the structure described in accordance with the present disclosure. In the example shown in FIG. 5, a memory device 100 may include at least one OTP bit (or OTP memory element) 40 and at least one multi-time programmable (MTP) bit (or MTP memory element) 42. The OTP bit 40 and the MTP bit 42 may be laterally adjacent to each other, such as being positioned on a same horizontal plane. The OTP bit 40 may include the electrically conductive structure 12 embedded in the interconnect dielectric material layer 10, the bottom electrode structure 14, the top electrode structure 26, and the MTJ pillar 18P. In an example, one bit of data may be written to the OTP bit 40 by applying an amount of voltage exceeding a breakdown voltage of the MTJ pillar 18P to cause an electrical short. The OTP bit 40, without voltage being applied, may register a logic bit '1'. The occurrence of the electrical short may cause the OTP bit 40 to register as logic '0'. The electrical short may be irreversible, thus causing the '0' to be permanently registered at the OTP bit 40. Thus, the OTP bit 40 may function as an anti-fuse device that is initialized with a high resistance and permanently creates an electrically conductive path when the voltage across the anti-fuse device exceeds a particular amount (e.g., breakdown voltage).

The MTP bit 42 may include an electrically conductive structure 12M, which may be same or different in size and/or dimensions when compared to the electrically conductive structure 12 of the OTP bit 40. The electrically conductive structure 12M may be embedded in the interconnect dielectric material layer 10. The MTP bit 42 may further include a bottom electrode structure 14M, which may be same or different in size and/or dimensions when compared to the bottom electrode structure 14 of the OTP bit 40. The MTP bit 42 may further include a MTJ pillar 18M that may have a size and/or dimension larger than the MTJ pillar 18P. The MTJ pillar 18M, in some examples, have a lateral cross section that is circular, and the lateral cross section 18M may have a smaller perimeter but larger area when compared to the lateral cross section of the MTJ pillar 18P of the OTP bit 40. Thus, the MTJ pillar 18M includes a damaged peripheral surface that is smaller than the damaged region (damaged region 32 in FIG. 3) of the MTJ pillar 18P. As a result of having the smaller damaged region, the MTJ pillar 18M may have a breakdown voltage greater than the breakdown voltage of the MTJ pillar 18P and experiences breakdown at a high voltage than the MTJ pillar 18P. The MTP bit 42 may further include a top electrode structure 26M that may have a size and/or dimension larger than the top electrode structure 26 of the OTP bit 40. In an example, the top electrode structure 26M may serve as an etch mask to pattern the MTJ pillar 18M. As is shown, the MTJ pillar 18M has a sidewall that is vertically aligned to the sidewall of the top electrode structure 26M. The MTJ pillar 18M may include a magnetic reference material 20M, a tunnel barrier material 22M, and a magnetic free material 24M.

In an example, a subset of OTP bit(s) 40 may be selected for a write operation (e.g., writing data to the memory device 100). A voltage exceeding the breakdown voltage of the OTP bit 40, but less than the breakdown voltage of the MTP bit 42, may be applied to the selected OTP bits. As a result of the OTP bit 40 having a lower breakdown voltage than the MTP bit 42, the selected OTP bits may experience an electrical short and thus registered as logic '0', without accidentally shorting the MTP bit 42 (or other MTP bits of the memory device 100). Therefore, data may be written to the OTP bit(s) without accidentally causing the MTP bit(s) of the memory device 100 to experience electrical shorts.

Further, the methods to construct the OTP memory elements in accordance with the present disclosure may be implemented in conjunction with the fabrication of MTP bits, which may improve an efficiency of manufacturing memory devices that comprises both OTP and MTP memory elements. A layout of the OTP memory elements and the MTP memory elements on the wafer of the memory device may be designed to allow fabrication of OTP and MTP memory elements in conjunction. For example, a design may have a plurality of OTP memory elements on a first section of a wafer, and have a plurality of MTP memory elements on a second section of the same wafer. A patterning process may be performed on the second section of the wafer to pattern the MTP memory elements to have MTJ pillars with a circular lateral cross section, and the patterning process may be performed on the first section of the wafer to pattern the OTP memory elements to have MTJ pillars with a non-circular lateral cross section.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A memory element comprising:
   a bottom electrode structure;
   a MTJ pillar having a non-circular lateral cross section and a bottommost portion forming an interface with an uppermost portion of the bottom electrode structure, wherein the MTJ pillar has a lateral perimeter-to-area ratio that defines a breakdown voltage of the MTJ pillar; and
   a top electrode structure located on the MTJ pillar.

2. The memory element of claim 1, wherein the lateral perimeter-to-area ratio ranges from 1:15 to 1:10.

3. The memory element of claim 1, wherein the lateral perimeter-to-area ratio defines the breakdown voltage of the MTJ pillar by defining a size of a peripheral damaged region of the MTJ pillar.

4. The memory element of claim 1, wherein the bottom electrode structure is located on a surface of an electrically conductive structure, and the electrically conductive structure is embedded in an interconnect dielectric material layer.

5. The memory element of claim 1, wherein the bottom electrode structure, the MTJ pillar, and the top electrode structure are components of a memory device.

6. The memory element of claim 1, wherein the bottom electrode structure, the MTJ pillar, and the top electrode structure are components of a one-time programmable (OTP) memory element.

7. The memory element of claim 1, wherein the MTJ has an elliptical lateral cross section.

8. A method of forming a one-time programmable (OTP) memory element, the method comprising:
   forming a multilayered magnetic tunnel junction (MTJ) stack on an uppermost portion of a bottom electrode structure;
   disposing a top electrode structure on the multilayered MTJ stack; and
   etching the multilayered MTJ stack utilizing the top electrode structure as an etch mask to provide a MTJ pillar having a non-circular lateral cross section, wherein the MTJ pillar has a lateral perimeter-to-area ratio that defines a breakdown voltage of the MTJ pillar.

9. The method of claim 8, wherein the etching of the multilayered MTJ stack comprises one or more reactive ion etching processes.

10. The method of claim 8, wherein the MTJ stack comprises a magnetic reference layer, a tunnel barrier layer, and a magnetic free layer, wherein the magnetic reference layer forms an interface with the uppermost portion of the bottom electrode structure.

11. The method of claim 8, wherein the lateral perimeter-to-area ratio ranges from 1:15 to 1:10.

12. The method of claim 8, wherein the lateral perimeter-to-area ratio defines the breakdown voltage of the MTJ pillar by defining a size of a peripheral damaged region of the MTJ pillar.

13. The method of claim 11, wherein the MTJ has an elliptical lateral cross section.

14. A memory device comprising:
   a first memory element including:
      a first bottom electrode structure;
      a first MTJ pillar having a non-circular lateral cross section and a bottommost portion forming an interface with an uppermost portion of the bottom electrode structure, wherein the first MTJ pillar has a lateral perimeter-to-area ratio that defines a first breakdown voltage of the first MTJ pillar; and
      a top electrode structure located on the first MTJ pillar; and
   a second memory element laterally adjacent to the first memory element and including a second MTJ pillar having second breakdown voltage greater than the first breakdown voltage of the first MTJ pillar.

15. The memory device of claim 14, wherein the first memory element is a one-time programmable (OTP) memory element.

16. The memory device of claim 14, wherein the second memory element is a multi-time programmable (MTP) memory element.

17. The memory device of claim 14, wherein the lateral perimeter-to-area ratio ranges from 1:15 to 1:10.

18. The memory device of claim 14, wherein the lateral perimeter-to-area ratio defines the first breakdown voltage of the first MTJ pillar by defining a size of a peripheral damaged region of the first MTJ pillar.

19. The memory device of claim 14, wherein a perimeter of the second MTJ pillar of the second memory element is less than a perimeter of the first MTJ pillar of the first memory element.

20. The memory device of claim 14, wherein an area of a lateral cross section of the second MTJ pillar of the second memory element is greater than an area of the non-circular lateral cross section of the first MTJ pillar of the first memory element.

* * * * *